(12) United States Patent
Zhang et al.

(10) Patent No.: US 6,689,674 B2
(45) Date of Patent: Feb. 10, 2004

(54) METHOD FOR SELECTIVE CHEMICAL VAPOR DEPOSITION OF NANOTUBES

(75) Inventors: Ruth Yu-ai Zhang, Gilbert, AZ (US); Raymond K. Tsui, Tempe, AZ (US); John Tresek, Jr., Phoenix, AZ (US); Adam M. Rawlett, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 10 days.

(21) Appl. No.: 10/140,548

(22) Filed: May 7, 2002

(65) Prior Publication Data

US 2003/0211322 A1 Nov. 13, 2003

(51) Int. Cl.[7] .......................... H01L 21/20; H01L 21/00
(52) U.S. Cl. ...................................... 438/584; 438/800
(58) Field of Search ................................. 438/584, 630, 438/669, 800; 9/574

(56) References Cited

U.S. PATENT DOCUMENTS

| | | | | |
|---|---|---|---|---|
| 6,346,189 B1 | * | 2/2002 | Dai et al. | 205/766 |
| 6,528,020 B1 | * | 3/2003 | Dai et al. | 422/98 |
| 2001/0023986 A1 | * | 9/2001 | Mancevski | 257/741 |
| 2002/0088938 A1 | * | 7/2002 | Colbert et al. | 250/306 |

* cited by examiner

*Primary Examiner*—Craig A. Thompson
(74) *Attorney, Agent, or Firm*—William E. Koch

(57) ABSTRACT

A method of fabricating a nanotube structure which includes providing a substrate, providing a mask region positioned on the substrate, patterning and etching through the mask region to form at least one trench, depositing a conductive material layer within the at least one trench, depositing a solvent based nanoparticle catalyst onto the conductive material layer within the at least one trench, removing the mask region and subsequent layers grown thereon using a lift-off process, and forming at least one nanotube electrically connected to the conductive material layer using chemical vapor deposition with a methane precursor.

12 Claims, 1 Drawing Sheet

METHOD FOR SELECTIVE CHEMICAL VAPOR DEPOSITION OF NANOTUBES

FIELD OF THE INVENTION

This invention relates generally to the fabrication of nanotube based electronic devices, and, more particularly, to the fabrication of electronic devices using nanotubes grown in a reaction chamber using a solvent based catalyst.

BACKGROUND OF THE INVENTION

Carbon is one of the most important known elements and can be combined with oxygen, hydrogen, nitrogen and the like. Carbon has four known unique crystalline structures including diamond, graphite, fullerene and carbon nanotubes. In particular, carbon nanotubes refer to a helical tubular structure grown with a single wall or multi-wall, which can be obtained by rolling a sheet formed of a plurality of hexagons. The sheet is formed by combining each carbon atom thereof with three neighboring carbon atoms to form a helical tube. Carbon nanotubes typically have a diameter in the order of a fraction of a nanometer to a few hundred nanometers.

Carbon nanotubes can function as either a conductor, like metals, or a semiconductor, according to the rolled shape and the diameter of the helical tubes. With metallic nanotubes, it has been found that a one-dimensional carbon-based structure can conduct a current at room temperature with essentially no resistance. Further, electrons can be considered as moving freely through the structure, so that metallic nanotubes can be used as ideal interconnects. Introducing a defect into a metallic tube can result in a single electron charging effect. The single electron charging effect can be used to make a single electron transistor. When semiconductor nanotubes are connected to two metal electrodes, the structure can function as a field effect transistor wherein the nanotubes can be switched from a conducting to an insulating state by applying a voltage to a gate electrode. Therefore, carbon nanotubes are potential building blocks for nanoelectronic devices because of their unique structural, physical, and chemical properties.

Existing methods for the production of nanotubes, including arc-discharge and laser ablation techniques, yield bulk materials with tangled nanotubes. The nanotubes in the bulk materials are mostly in bundled forms. These tangled nanotubes are extremely difficult to purify, isolate, manipulate, and use as discrete elements for making functional devices. Originally, carbon nanotubes produced by an arc discharge between two graphite rods was discovered and reported in an article entitled "Helical Microtubules of Graphitic Carbon" (Nature, Vol. 354, Nov. 7, 1991, pp. 56–58) by Sumio Iijima. This technique is commonly used to produce carbon nanotubes, however, yield of pure carbon nanotubes with respect to the end product is only about 15%. Thus, a complicated purification process must be carried out for particular device applications.

Another conventional approach to produce carbon nanotubes, which was described in an article entitled "Epitaxial Carbon Nanotube Film Self-organized by Sublimation Decomposition of Silicon Carbide" (Appl. Phys. Lett. Vol. 71, pp. 2620, 1977), by Michiko Kusunoki, is to produce carbon nanotubes at high temperatures by irradiating a laser onto graphite or silicon carbide. In this case, the carbon nanotubes are produced from graphite at about 1200° C. or more and from silicon carbide at about 1600° C. to 1700° C. However, this method also requires multiple stages of purification which increases the cost. In addition, this method has difficulties for large-device applications.

Some of the drawbacks of these two methods are that the tubes are formed under an extremely high temperature environment and are usually produced as bundles, embedded with catalyst particles which are covered with amorphous carbon. To fabricate devices using nanotubes produced from these methods, various cleaning and debundling steps are required. The debundled nanotubes are then suspended in a solution, which can then be positioned on a substrate with patterned electrodes or other circuitry. However, it is extremely difficult to control the placement and orientation of the nanotubes when using these methods. It is therefore very inefficient to fabricate electronic devices using nanotubes formed either by arc discharge or laser ablation.

U.S. Pat. No. 6,346,189 issued to Dai et al. on Feb. 12, 2002 discloses a method of selectively producing high quality single walled carbon nanotubes on a substrate using catalyst islands. The catalyst particles consisting of $Fe_2O_3$ or other transition metal oxides are suspended in methanol. According to the method, a first lithography step is used to pattern a substrate with catalyst islands, wherein the first lithography step uses e-beam lithography. Nanotubes are then grown using a chemical vapor deposition process. Electrical contact to the nanotubes is made by performing a second lithography step to form electrodes. However, during the second lithography step, the nanotubes may be damaged and contaminated.

Accordingly, it is an object of the present invention to provide a new and improved approach for fabricating nanotube based electronic devices.

SUMMARY OF THE INVENTION

To achieve the objects and advantages specified above and others, a method of fabricating a nanotube structure is disclosed which includes providing a substrate, providing a mask region positioned on the substrate, and patterning and etching through the mask region to form at least one trench. A conductive material layer is deposited within the at least one trench and a nanoparticle catalyst is deposited onto the conductive material layer within the at least one trench. The mask region is removed using a conventional lift-off technique, such as a single step lift-off process, to form nanoparticle catalyst coated electrodes. The nanotubes are formed from the catalyst using a reaction chamber with a hydrocarbon gas atmosphere.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
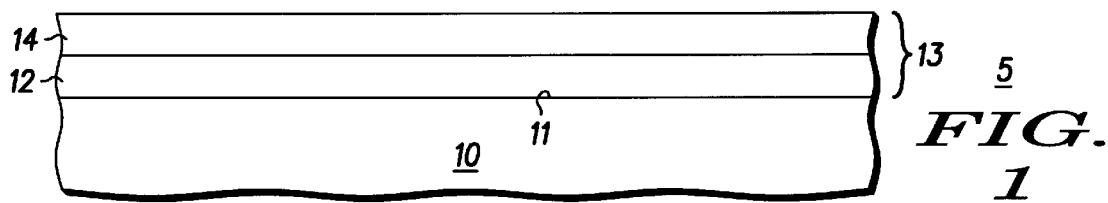
FIG. 1 is a cross sectional view of a step in a sequence of fabricating a nanotube structure.

Turn now to FIG. 1 which illustrates a step in a method to fabricate a nanotube structure 5 in accordance with the present invention. In the preferred embodiment, nanotube structure 5 includes a substrate 10 wherein substrate 10 includes silicon. However, it will be understood that other substrate materials may be appropriate, such as a glass, a ceramic, a metal, or other semiconductor materials. Other semiconductor materials can include, for example, gallium arsenide (GaAs) or the like. Further, substrate 10 can include control electronics or other circuitry, which are not shown in this embodiment for simplicity. Also, substrate 10 can include an insulating layer, such as silicon oxide (SiO), silicon nitride (SiN), or the like.

A mask region 13 is positioned on surface 11 of substrate 10. In the preferred embodiment, mask region 13 includes a bi-layer resist of a photoresist layer 14 positioned on surface 11 and a photoresist layer 14 positioned on layer 12. A bi-layer resist is used in the preferred embodiment to facilitate the lift-off process, as will be discussed separately.

Figure 2:
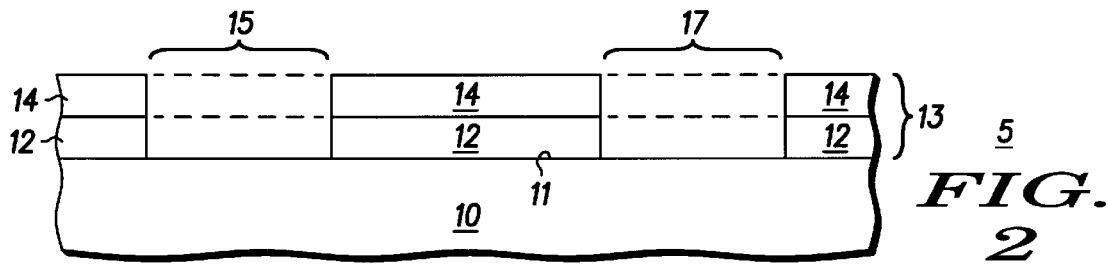
FIG. 2 is a cross sectional view of another step in the sequence of fabricating a nanotube structure.

As illustrated in FIG. 2, mask region 13 is patterned and etched through layers 12 and 14 to form at least one trench. In the preferred embodiment, a trench 15 and a trench 17 are formed within mask region 13, but it will be understood that it is anticipated that an array of trenches could be formed therewith. In this embodiment, two trenches are illustrated for simplicity and ease of discussion. Further, mask region 13 can be patterned using optical lithography, e-beam lithography, or other techniques well known to those skilled in the art.

Figure 3:
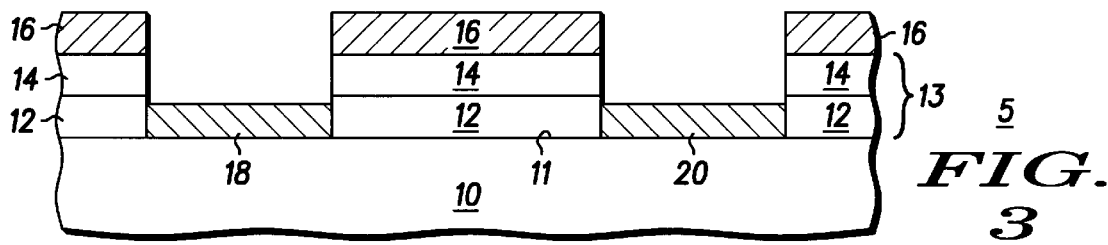
FIG. 3 is a cross sectional view of still yet another step in the sequence of fabricating a nanotube structure.

Turning now to FIG. 3, a conductive material layer 18 is deposited on surface 11 within trench 15 and a conductive material layer 20 is deposited on surface 11 within trench 17. Further, it is anticipated that a conductive material layer 16 will be formed on mask region 13 as illustrated. In the preferred embodiment, layers 16, 18, and 20 include gold (Au), but it will be understood that other conductive materials, such as aluminum (Al), platinum (Pt), silver (Ag), copper (Cu), or the like, may be used.

Further, in the preferred embodiment, layers 16, 18, and 20 are illustrated to include the same conductive material for simplicity, but it will be understood that they can include different conductive materials. For example, layer 18 can include gold (Au), layer 16 can include aluminum (Al), and layer 20 can include platinum (Pt) wherein it will be understood that the fabrication sequence would be, in general, different from the preferred embodiment. However, the differences are well known to those skilled in the art and will not be elaborated upon further here.

Figure 4:
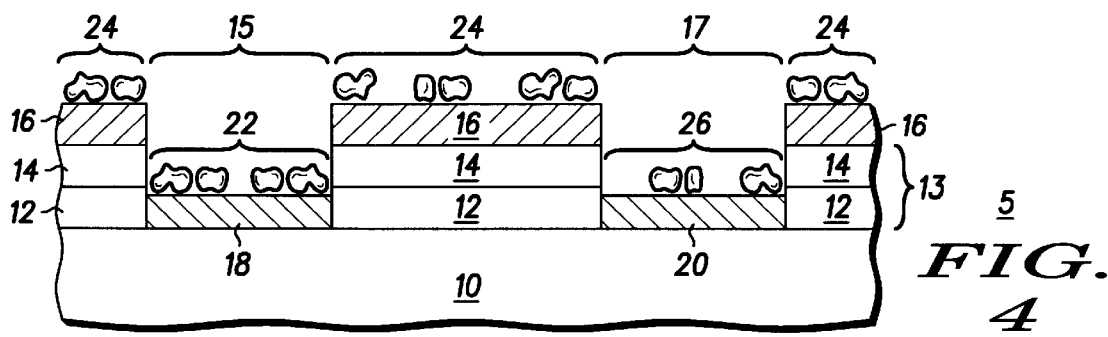
FIG. 4 is a cross sectional view of a step in the sequence of fabricating a nanotube structure.

Turning now to FIG. 4, a solution containing nanoparticle catalyst 22 is deposited on conductive material layer 18, a nanoparticle catalyst 24 is deposited on conductive material layer 16, and a nanoparticle catalyst 26 is deposited on conductive material layer 20. Nanoparticle catalysts 22, 24, and 26 include nanoparticles suspended within the solvent which is compatible with the material included in mask region 13. In the preferred embodiment, the nanoparticles can include a transition metal, such as iron (Fe), nickel (Ni), cobalt (Co), or the like, or another suitable nanoparticle catalyst well known to those skilled in the art. Further, catalysts 22, 24, and 26 can be deposited by several methods including spraying on, spinning on, or the like, which are well known to those skilled in the art.

Figure 5:
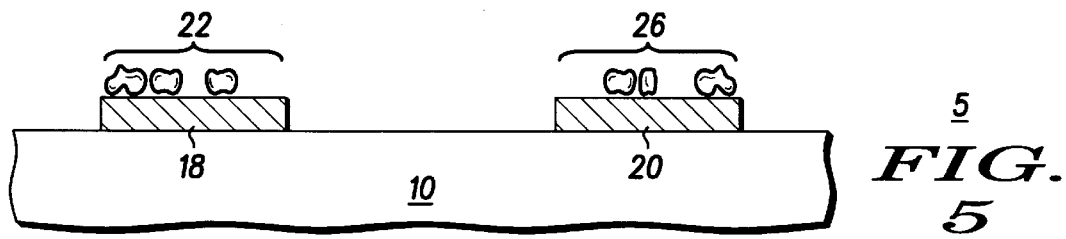
FIG. 5 is a cross sectional view of another step in the sequence of fabricating a nanotube structure.

Turning now to FIG. 5, a lift-off process is performed to remove mask region 13 from substrate 10. Further, conductive material layer 16 with catalyst particles 24 thereon is also removed during the liftoff.

Figure 6:
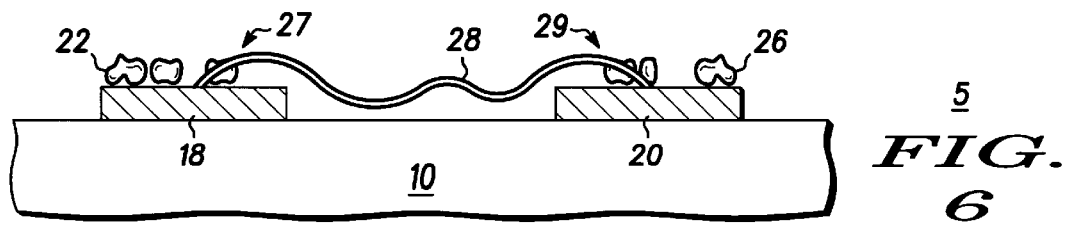
FIG. 6 is a cross sectional view of still yet another step in the sequence of fabricating a nanotube structure.

Turning now to FIG. 6, nanotube structure 5 is placed in a reaction chamber with a hydrocarbon gas atmosphere to form at least one nanotube 28. The reaction chamber can include a chemical vapor deposition chamber, a chemical beam epitaxy chamber, a molecular beam epitaxy chamber, or the like. Further, in the preferred embodiment, the hydrocarbon gas atmosphere includes methane. However, it will be understood that the hydrocarbon gas atmosphere can include other gases, such as ethylene, acetylene, carbon monoxide, or the like. In the preferred embodiment, a single nanotube 28 is illustrated, but it will be understood that a plurality of nanotubes could be formed and electrically connect layers 18 and 20. However, a single nanotube is illustrated in this embodiment for simplicity and ease of discussion.

In the preferred embodiment, nanotube 28 is a carbon nanotube, but it will be understood that nanotube 28 can include other nanotube forming materials, such as boron nitride (BN), with the desired electrical and physical properties. In the preferred embodiment, an end 27 of nanotube 28 is electrically connected to conductive material layer 18 and an end 29 is electrically connected to conductive material layer 20. During the formation of nanotube 28, an electric field may be applied between layers 18 and 20 to align nanotube 28 in a preferred direction and facilitate the electrical connection therewith.

Thus, a new and improved method of fabricating a nanotube structure has been disclosed. The method involves using a single step patterning process which simplifies the fabrication process. A bi-layer resist patterning process is used to facilitate the lift off process and reduce residual catalyst particles that may be present in undesired regions when using a single resist layer. The method also involves using a solvent, which in the preferred embodiment is water ($H_2O$), to suspend the nanoparticle catalyst. Water is a solvent that is compatible with most resist material included in mask region 13, and, therefore, eliminates pattern deformation caused by the reaction between an organic solvent and mask region 13. Another important aspect of this method is that contamination of the nanotubes is minimized. Further, the nanotubes are less likely to be damaged. Contamination and damage typically occur during a post nanotube growth patterning process. Further, this method allows the alignment of the nanotubes with an electric field during chemical vapor deposition processing.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A method of fabricating nanotube structures comprising the steps of:
    providing a substrate with a surface;
    providing a mask region positioned on the surface of the substrate;
    patterning and etching through the mask region to form at least one trench; depositing a conductive material layer on the surface of the substrate and within the at least one trench;

depositing a nanoparticle catalyst suspended in a solvent on an uppermost surface of and adjacent with the conductive material layer and within the at least one trench;

removing the mask region and subsequent layers deposited thereon; and growing at a temperature of less than 1000° C., at least one nanotube on the uppermost surface of and adjacent with the conductive material layer, wherein the at least one nanotube is electrically connected to the conductive material layer using a reaction chamber.

2. A method as claimed in claim 1 wherein the conductive material layer includes one of gold, aluminum, platinum, silver, copper, and another suitable conductive material.

3. A method as claimed in claim 1 wherein the at least one nanotube includes one of carbon, boron nitride, and another suitable nanotube forming material.

4. A method as claimed in claim 1 wherein the nanoparticle catalyst includes one of iron, nickel, cobalt, and another suitable transition metal.

5. A method as claimed in claim 1 wherein the mask region includes one of silicon oxide and another suitable photoresist material.

6. A method as claimed in claim 1 wherein the step of depositing the nanoparticle catalyst includes one of spraying on and spinning on the nanoparticle catalyst.

7. A method as claimed in claim 1 wherein the mask region includes a first photoresist layer and a second photoresist layer.

8. A method as claimed in claim 1 wherein the mask region includes a bi-layer photoresist.

9. A method as claimed in claim 1 wherein the step of removing the mask region includes using a conventional lift-off process.

10. A method as claimed in claim 1 wherein the step of forming the at least one nanotube includes a step of using one of methane, ethylene, acetylene, carbon monoxide, and another suitable hydrocarbon gas atmosphere within the reaction chamber.

11. A method as claimed in claim 1 wherein the reaction chamber includes one of a chemical vapor deposition chamber, a molecular beam epitaxy chamber, a chemical beam epitaxy chamber, and another suitable chamber.

12. A method as claimed in claim 1 wherein the nanoparticle catalyst includes one to water and another suitable solvent.

* * * * *